United States Patent
Cai et al.

(10) Patent No.: US 9,576,956 B2
(45) Date of Patent: Feb. 21, 2017

(54) METHOD AND STRUCTURE OF FORMING CONTROLLABLE UNMERGED EPITAXIAL MATERIAL

(71) Applicants: INTERNATIONAL BUSINESS MACHINES CORPORATION, Armonk, NY (US); GLOBALFOUNDRIES INC., Cayman Islands (KY)

(72) Inventors: Xiuyu Cai, Niskayuna, NY (US); Kangguo Cheng, Schenectady, NY (US); Ali Khakifirooz, Los Altos, CA (US); Ruilong Xie, Niskayuna, NY (US); Tenko Yamashita, Schenectady, NY (US)

(73) Assignees: INTERNATIONAL BUSINESS MACHINES CORPORATION, Armonk, NY (US); GLOBALFOUNDRIES INC. (KY)

(*) Notice: Subject to any disclaimer, the term of this patent is extended or adjusted under 35 U.S.C. 154(b) by 0 days.

(21) Appl. No.: 15/157,861

(22) Filed: May 18, 2016

(65) Prior Publication Data
US 2017/0012042 A1    Jan. 12, 2017

Related U.S. Application Data

(62) Division of application No. 14/796,646, filed on Jul. 10, 2015.

(51) Int. Cl.
| | | |
|---|---|---|
| H01L 27/088 | (2006.01) | |
| H01L 27/02 | (2006.01) | |
| H01L 29/78 | (2006.01) | |
| H01L 29/66 | (2006.01) | |
| H01L 29/417 | (2006.01) | |
| H01L 29/06 | (2006.01) | |
| H01L 21/336 | (2006.01) | |

(52) U.S. Cl.
CPC ...... *H01L 27/0886* (2013.01); *H01L 27/0207* (2013.01); *H01L 29/0649* (2013.01); *H01L 29/41791* (2013.01); *H01L 29/66795* (2013.01); *H01L 29/785* (2013.01)

(58) Field of Classification Search
CPC .......... H01L 29/6656; H01L 29/41791; H01L 29/785; H01L 29/66795; H01L 27/0886; H01L 27/0207; H01L 29/0649
USPC ................................. 257/401; 438/284, 286
See application file for complete search history.

(56) References Cited

U.S. PATENT DOCUMENTS

| | | | |
|---|---|---|---|
| 7,385,247 B2 | 6/2008 | Rhee et al. | |
| 7,851,865 B2 | 12/2010 | Anderson et al. | |
| 9,059,002 B2 | 6/2015 | He et al. | |
| 2011/0049583 A1 | 3/2011 | Lin et al. | |

(Continued)

*Primary Examiner* — Long K Tran
(74) *Attorney, Agent, or Firm* — Tutunjian & Bitetto, P.C.; Vazken Alexanian

(57) ABSTRACT

A method of forming a semiconductor device that includes forming a plurality of semiconductor pillars. A dielectric spacer is formed between at least one set of adjacent semiconductor pillars. Semiconductor material is epitaxially formed on sidewalls of the adjacent semiconductor pillars, wherein the dielectric spacer obstructs a first portion of epitaxial semiconductor material formed on a first semiconductor pillar from merging with a second portion of epitaxial semiconductor material formed on a second semiconductor pillar.

20 Claims, 11 Drawing Sheets

(56) References Cited

U.S. PATENT DOCUMENTS

| | | |
|---|---|---|
| 2011/0079829 A1 | 4/2011 | Lai et al. |
| 2012/0025316 A1 | 2/2012 | Schultz |
| 2012/0043610 A1 | 2/2012 | Cheng et al. |
| 2012/0104472 A1 | 5/2012 | Xu et al. |
| 2014/0167162 A1 | 6/2014 | He et al. |
| 2014/0217517 A1 | 8/2014 | Cai et al. |
| 2015/0200300 A1* | 7/2015 | Ching ............... H01L 21/02238 257/397 |
| 2016/0005656 A1* | 1/2016 | Ching ............. H01L 21/823821 438/283 |

* cited by examiner

METHOD AND STRUCTURE OF FORMING CONTROLLABLE UNMERGED EPITAXIAL MATERIAL

BACKGROUND

Technical Field

The present disclosure relates to semiconductor devices, and more particularly to semiconductor devices including fin structures and epitaxially formed semiconductor materials.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one embodiment, the present disclosure provides a method of forming a semiconductor device comprising forming a plurality of semiconductor fin structures. A dielectric spacer is formed between at least one set of adjacent semiconductor fin structures in said plurality of semiconductor fin structures. Semiconductor material is epitaxially formed on sidewalls of at least said adjacent semiconductor fin structures. The dielectric spacer obstructs a first portion of epitaxial semiconductor material formed on a first semiconductor pillar of said adjacent semiconductor fin structures from merging with a second portion of epitaxial semiconductor material formed on a second semiconductor pillar of said adjacent semiconductor fin structures.

In another embodiment, a method of forming a semiconductor device is provided that includes forming a plurality of semiconductor fin structures and dielectric fin structures, wherein the dielectric fin structures are positioned outside a perimeter of the plurality of semiconductor fin structures. The method may further include forming a first dielectric spacer between adjacent semiconductor fin structures of said plurality of semiconductor fin structures, and forming a second dielectric fin structure between a dielectric fin structure and a perimeter semiconductor fin structure of said plurality of semiconductor fin structures. The method may further include epitaxially forming semiconductor material on said plurality of semiconductor fin structures. The first dielectric spacer obstructs a first portion of epitaxial semiconductor material formed on said adjacent fin structures from merging. The second dielectric spacer controls a width of semiconductor material formed on outside sidewalls of said perimeter semiconductor fin structures.

In another aspect of the present disclosure, a semiconductor device is provided that includes a plurality of fin structures. The semiconductor device may include at least one fin-type field effect transistor (FinFET). In some embodiments, a dielectric spacer is present within the space between adjacent fin structures. An epitaxial semiconductor is present on a first sidewall of a first fin structure of the adjacent fin structures and a second sidewall of a second fin structure of the adjacent fins structures. The epitaxial semiconductor material that is in contact with the first and second fin structures of the adjacent fin structures may also contact the dielectric spacer. The dielectric spacer obstructs a first portion of epitaxial semiconductor material formed on the first sidewalls from merging with a second portion of epitaxial semiconductor material formed on the second sidewall.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
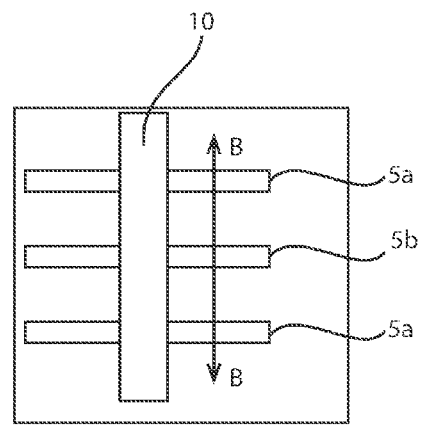
FIG. 1A is a top-down view of a plurality of fin structures and a gate structure, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a method for controlling epitaxial growth of semiconductor material between pillar shapes of semiconductor material (hereafter referred to as fin structures) so that the epitaxial semiconductor material does not bridge the semiconductor fin structures. As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure.

The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The epitaxial material formed on the fin structures of Fin Field Effect Transistors (FinFET) may provide a component of the source and drain regions of the FinFET. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

When the epitaxial material that is being formed on a first fin structure of a plurality of fin structures extends across the dimension separating adjacent fin structures, in which the epitaxial material is in direct contact with two adjacent, i.e., neighboring, fin structures, that epitaxial material may be referred to as "merged epitaxial material". Some disadvantages of merged epitaxial material is that with too much lateral growth on the sidewalls of the fin structures shorts, such as source/drain shorts, may occur. Further, non-uniform thickness of epitaxial semiconductor material on the fin structure of a FinFET, such as non-uniform thicknesses of source and drain regions, may result in disadvantageous device performance variations.

In some embodiments, the present disclosure provides a means to avoid the formation of merged epitaxial material in devices including fin structures, which can also be referred to as semiconductor pillars. For example, a method can be provided that includes forming a plurality of fin structures, and forming a dielectric spacer between at least one set of adjacent fin structures. As the semiconductor material is epitaxially on the sidewalls of the adjacent fin structures, the dielectric spacer obstructs a first portion of epitaxial semiconductor material that formed on a first fin structure of the adjacent semiconductor fin structures from merging with a second portion of epitaxial semiconductor material formed on a second fin structure of the adjacent fin structures. The methods and structures of the present disclosure are now discussed with more detail referring to FIGS. 1-21.

Figure 1B:
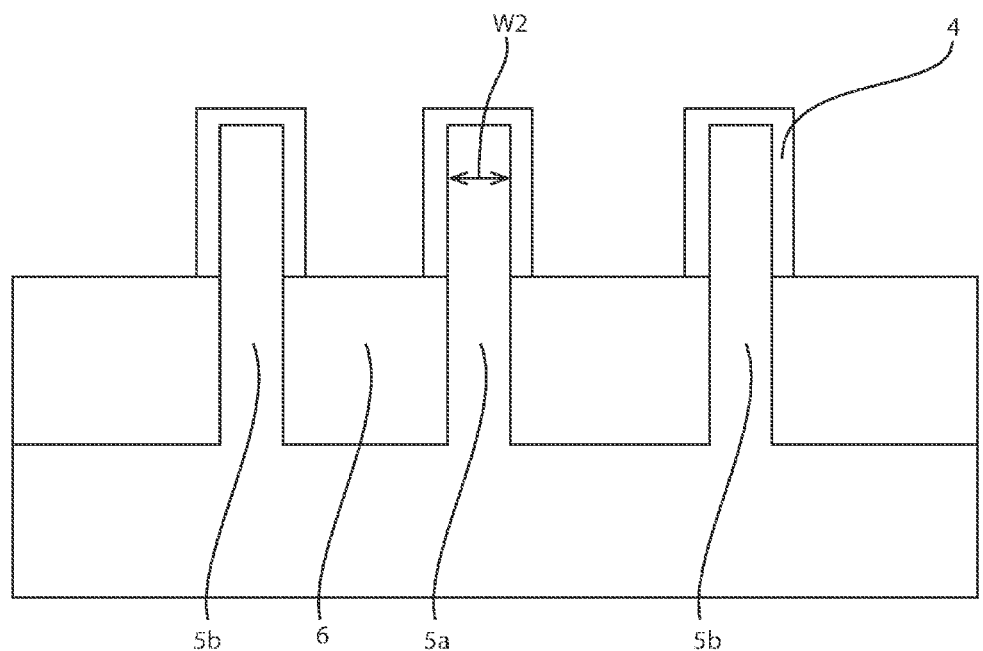
FIG. 1B is side cross-sectional view along section line B-B of the structure depicted in FIG. 1A.

FIGS. 1A and 1B depict a gate structure 10 that is present on a plurality of fin structures 5a, 5b. The semiconductor material that provides the fin structures 5a, 5b may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors.

The plurality of fin structures 5a, 5b may be formed from a bulk semiconductor substrate, or semiconductor on insulator (SOI) substrate, using deposition photolithography and etch processes. In one embodiment, the patterning process used to define each of the fin structures 5a, 5b is a sidewall image transfer (SIT) process. The SIT process can include forming a mandrel material layer (not shown) on the material layer that provides the fin structures 5a, 5b, such as the SOI layer of an SOI substrate. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 5a, 5b, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 5a, 5b.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 5a, 5b, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 5a, 5b. Following etching, i.e., pattern transfer, the SIT process may conclude with removing the dielectric spacers using an etch process or a planarization process.

It is noted that the aforementioned spacer image transfer (SIT) process is only one method of forming the fin structures 5a, 5b. In another embodiment, each of the fin structures 5a, 5b may be formed using a photoresist etch mask. Specifically, in one example, a photoresist mask is formed overlying the semiconductor composition layer which provides the fin structures 5a, 5b. The exposed portions of the semiconductor layer that provides the fin structures 5a, 5b that are not protected by the photoresist mask are removed using a selective etch process. To provide the photoresist mask, a photoresist layer is first positioned on the semiconductor layer that provides the fin structure 5a, 5b, e.g., SOI layer of an SOI substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 5a, 5b. The etch process may be an anisotropic process, such as reactive ion etch (RIE).

In the embodiment that is depicted in FIGS. 1A and 1B, the fin structures 5a, 5b are formed by etching a bulk semiconductor substrate, wherein isolation between adjacent fin structures 5a, 5b is provided by a dielectric fill 6 that has been deposited into the trenches separating the adjacent fin structures 5a, 5b. The dielectric fill 6 may be an oxide, nitride or oxynitride material. For example, the dielectric fill 6 may be composed of silicon oxide or silicon nitride.

Each of the fin structures 5a, 5b may have a height $H_1$ ranging from 5 nm to 200 nm. In another embodiment, each of the fin structures 5a, 5b has a height $H_1$ ranging from 10 nm to 100 nm. In one example, each of the fin structures 5a, 5b has a height $H_1$ ranging from 20 nm to 50 nm. Each of the plurality of fin structures 5a, 5b may have a width $W_1$ of less than 20 nm. In another embodiment, each of the fin structures 5a, 5b has a width $W_1$ ranging from 3 nm to 8 nm.

Although two fin structures 5a, 5b are depicted in FIG. 1, the present disclosure is not limited to only this example. It is noted that any number of fin structures 5a, 5b may be formed from the bulk semiconductor substrate 1. The pitch P1 separating adjacent fin structures 5a, 5b may range from 35 nm to 45 nm. In another example, the pitch P1 separating adjacent fin structures 5a, 5b may range from 30 nm to 40 nm.

It is noted that embodiments have been contemplated in which the plurality of fin structures 5a, 5b may include different groups of fin structures separated by a different pitch dimensions. For example, a first group of fin structures 5a, 5b may include a first plurality of fin structures that separated by a first pitch, and a second group of fin structures may include a second plurality of fin structures that are separated by a second pitch, in which the first pitch may be different than the second pitch, e.g., the first pitch is greater than the second pitch.

In some embodiments, a native dielectric 4, e.g., native oxide ($SiO_2$), may be present on the sidewalls of the fin structures 5a, 5b. The native oxide ($SiO_2$) may form on the semiconductor surface of the fin structures 5a, 5b by expose to an oxygen containing ambient.

FIGS. 1A and 1B further depict forming a gate structure 10 on the channel portion of the fin structures 5a, 5b. The "gate structure" functions to switch the semiconductor device from an "on" to "off" state, and vice versa. The gates structure 10 is formed on the channel region of the fin structures 5a, 5b. The gate structure 10 typically includes at least a gate dielectric that is present on the channel region of the fin structure 5a, 5b, and a gate electrode that is present on the gate dielectric.

In one embodiment, the at least one gate dielectric layer includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer has a thickness from 1 nm to 10 nm. In another embodiment, the at least one gate dielectric layer has a thickness from 1 nm to 3 nm.

The conductive material of the gate electrode may comprise polysilicon, SiGe, a silicide, a metal or a metal-silicon-nitride such as Ta—Si—N. Examples of metals that can be used as the gate electrode include, but are not limited to, Al, W, Cu, and Ti or other like conductive metals. The layer of conductive material for the gate electrode may be doped or undoped. If doped, an in-situ doping deposition process may be employed. Alternatively, a doped conductive material can be formed by deposition, ion implantation and annealing.

The gate structure 10 may be formed by using a deposition method, such as a chemical vapor deposition method and/or a physical vapor deposition (PVD), to deposit the material layers for the at least one gate dielectric layer and the at least one gate electrode followed by photolithography and etch processing.

In some embodiments, a gate sidewall spacer (not shown) can be formed on the sidewall of the gate structure 10. In one embodiment, the gate sidewall spacer may be formed by using a blanket layer deposition process, such as CVD, and an anisotropic etchback method. The gate sidewall spacer may have a width ranging from 2.0 nm to 15.0 nm, and may be composed of a dielectric, such as a nitride, oxide, oxynitride, or a combination thereof.

Figure 2:
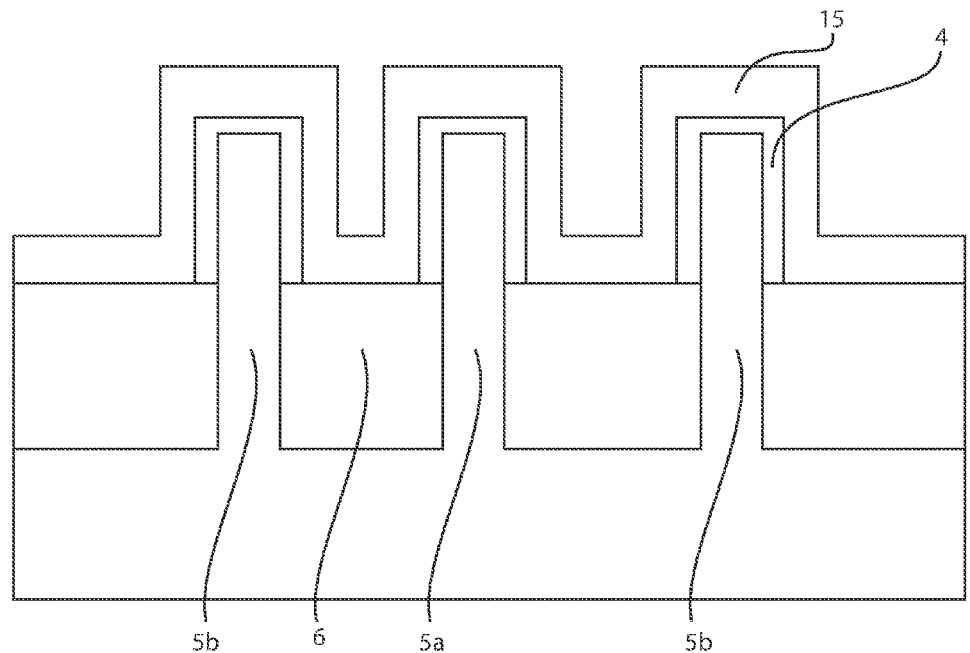
FIG. 2 is a side cross-sectional view depicting depositing a conformal first dielectric layer for forming a dielectric spacer between the adjacent fin structures that are depicted in FIG. 1B, in accordance to one embodiment of the present disclosure.

FIG. 2 depicts depositing a conformal first dielectric layer 15 for forming a dielectric spacer between the adjacent fin structures 5a, 5b that are depicted in FIG. 1B. The term "conformal" denotes a layer having a thickness that does not deviate from greater than or less than 30% of an average value for the thickness of the layer. The conformal first dielectric layer 15 may be composed of any dielectric material, such as a nitride containing dielectric, e.g., silicon nitride; an oxide containing dielectric, e.g., silicon oxide ($SiO_2$); or a combination thereof, such as silicon oxynitride. In one example, the conformal first dielectric layer 15 is composed of silicon carbon boron nitride (SiCBN). It is noted that any dielectric material may be suitable for the conformal first dielectric layer 15 so long as the material selected for the conformal first dielectric layer 15 provides that the conformal first dielectric layer 15 may be etched selectively to the later deposited second dielectric layer.

The conformal first dielectric layer 15 may be deposited using a conformal dielectric process. The conformal dielectric layer 15 is deposited on the sidewalls and upper surfaces of the fin structures 15 and atop the exposed surfaces of the fill dielectric 6 that is present in the space separating the adjacent fin structures 15. For example, the conformal dielectric layer 15 may be deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In one embodiment, the thickness of the conformal first dielectric layer 15 typically ranges from 4 nm to 20 nm. In another embodiment, the thickness of the conformal first dielectric layer 15 ranges from 4 nm to 10 nm.

Figure 3:
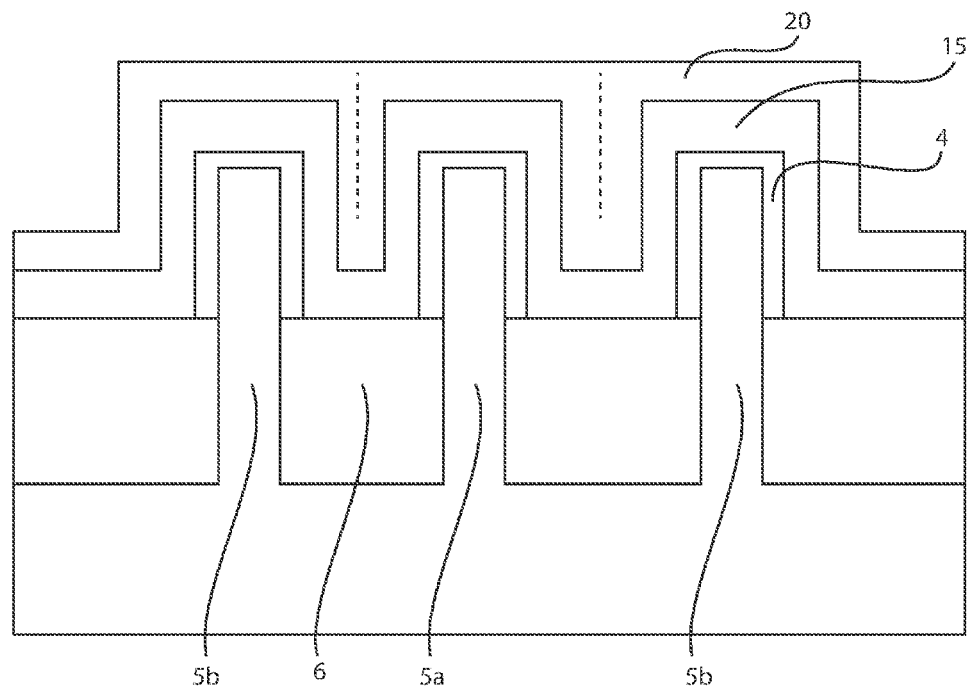
FIG. 3 is a side cross-sectional view depicting a second dielectric layer for forming a dielectric spacer between adjacent fin structures, in which the second dielectric layer can pinch off, i.e., can fill, the space between the adjacent fins structures, in accordance with one embodiment of the present disclosure.

FIG. 3 depicts forming a second dielectric layer 20 atop the conformal first dielectric layer 15 for forming the spacer between adjacent fin structures 5. As will be described below, the dielectric spacer positioned between the adjacent fin structures for obstructing the formation of merged epitaxial semiconductor material is a composite structure of the first and second dielectric layer 15, 20. In some embodiments, it is not necessary that the second dielectric layer 20 be a conformal dielectric layer, but the second dielectric layer 20 can be a conformal layer. Typically, the second dielectric layer 20 is deposited so that the second dielectric layer can pinch off, i.e., can fill, the space between the adjacent fins structures 5a, 5b, as depicted in FIG. 3.

The composition of the second dielectric layer 20 is selected so that the first and second dielectric layers 15, 20 can be etched selectively to one another. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. Depending on the composition of the conformal first dielectric layer 15, the second dielectric layer 20 may be an oxide, such as silicon oxide ($SiO_2$); nitride, such as silicon nitride; a silicon oxynitride or a combination thereof. Other dielectric materials that may be selected for the second dielectric layer 20 include hafnium oxide ($HfO_2$) or aluminum oxide ($Al_2O_3$).

The deposition processing may be selected to fill the space between adjacent fin structures 5a, 5b with the second dielectric layer 20. In some examples, the space between the adjacent fin structures 5a, 5b may be filled with a second dielectric layer 20 that is deposited by atomic layer deposition (ALD). In other examples, the second dielectric layer 20 may be deposited by a chemical vapor deposition (CVD) process that may include, but is not limited to, Atmospheric Pressure CVD (APCVD), Low Pressure CVD (LPCVD) and Plasma Enhanced CVD (PECVD), Metal-Organic CVD (MOCVD), high density plasma and combinations thereof may also be employed. In addition to CVD and ALD, the second dielectric layer may also be deposited using spin-coating, brush coating, chemical solution deposition, and physical vapor deposition methods.

The second dielectric layer is deposited to a thickness that fills the space between the adjacent fin structures. In the embodiments, in which the second dielectric layer 20 is a conformally deposited layer that is deposited directly atop the conformal first dielectric layer 15, the second dielectric layer 20 may have a thickness ranging from 2 nm to 50 nm. In another embodiment, the second dielectric layer 20 may have a thickness ranging from 4 nm to 15 nm.

Figure 4:
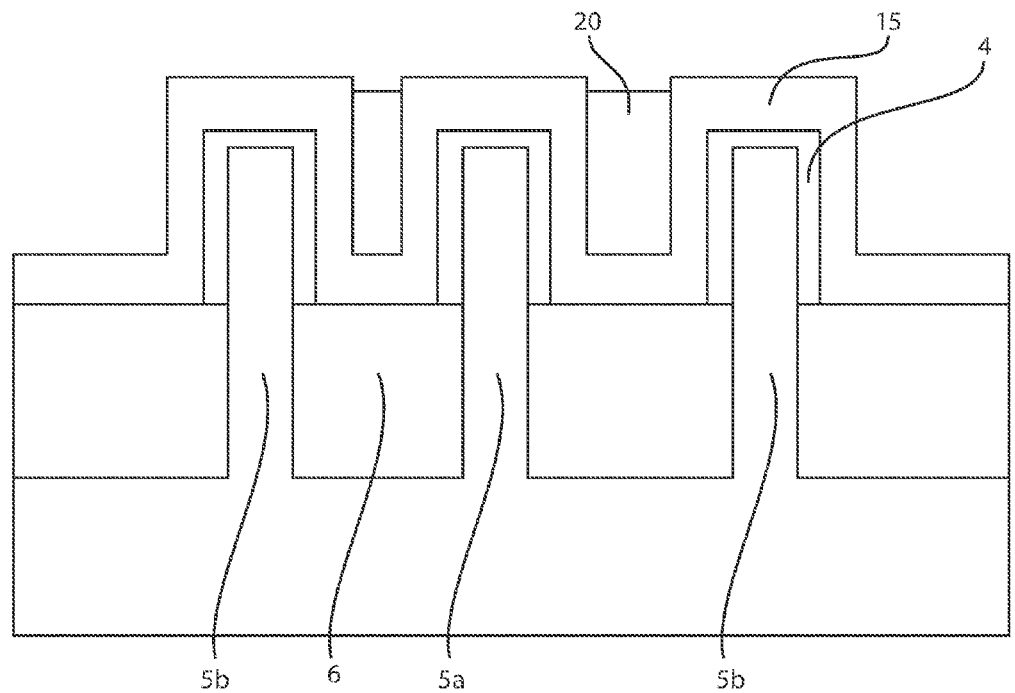
FIG. 4 is a side cross-sectional view depicting isotropically etching the second dielectric layers to recess the second dielectric layer in the space that is present between the adjacent fin structures, in accordance with one embodiment of the present disclosure.

FIG. 4 depicts isotropically etching the second dielectric layer 20 to at least recess the second dielectric layer 20 in the space that is present between adjacent fin structures 5a, 5b. The term "isotropic" and/or "isotropically" denote a non-directional etch process, i.e., an etch process in which the rate of etch in one direction is not substantially greater than the other directions. In some embodiments, the isotropic etch process that is employed at this stage of the process flow is a plasma etch, gas phase etch, or wet chemical etch. In some embodiments, the isotropic etch removes the second dielectric layer 20 that are overlying the fin structures 5a, 5b to expose the portions of the conformal first dielectric layer 15 that are present on the upper surfaces of the fin structures 5a, 5b. The isotropic etch may also remove the portions of the second dielectric layer 20 that are present on the outer sidewalls of the perimeter fin structures 5a, 5b. Following the isotropic etch, the remaining portion of the second dielectric layer 20 is present only in the space separating the adjacent fin structures atop the conformal first dielectric layer 15. Although the second dielectric layer 20 may be recessed within the openings separating the adjacent fin structures 5a, 5b, the majority of the second dielectric layer 20 that was present between the adjacent fin structures prior to the isotropic etch remains following the isotropic etch. As will be further explained below, the remaining portion of the second dielectric layer 20 provides the upper layer of the dielectric fin that is employed to control epitaxial merging.

The isotropic etch typically includes an etch chemistry that removes the second dielectric layer 20 selectively to the conformal first dielectric layer 15. In some embodiments, etch selectivity may be aided with the use of etch masks, such as photoresist masks.

Figure 5:
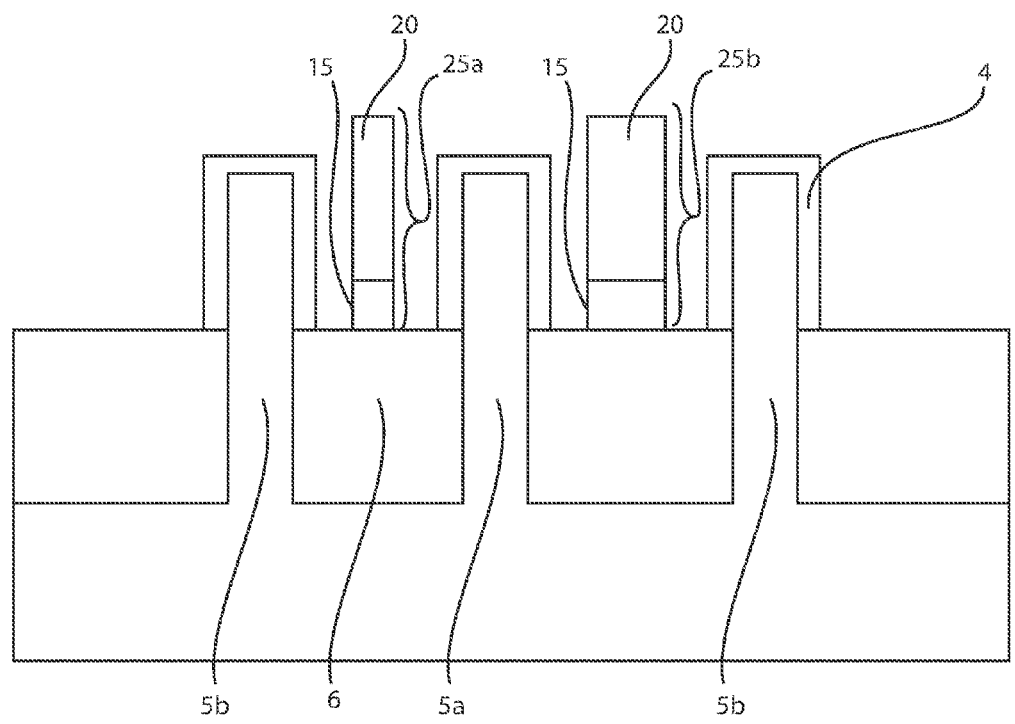
FIG. 5 is a side cross-sectional view depicting an anisotropic etch step for removing vertical portions of the conformal first dielectric layer, in accordance with one embodiment of the present disclosure.

FIG. 5 depicts one embodiment of an anisotropic etch process for removing vertical portions of the first dielectric layer 15. As used herein, an "anisotropic etch process" denotes a material removal process in which the etch rate in the direction normal to the surface to be etched is greater than in the direction parallel to the surface to be etched. In the embodiment depicted in FIG. 5, an anisotropic etch is employed to remove the exposed portions of the conformal first dielectric layer 15 that are depicted in FIG. 4. During this etch step, the remaining portion of the second dielectric layer 20 may function as an etch mask to protect the directly underlying portion of the conformal first dielectric layer 15.

The anisotropic etch process for removing the vertical portions of the first dielectric layer 15 may be a reactive ion etch (RIE) process. Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

The anisotropic etch process may also remove the material of the conformal dielectric layer 15 selectively to the remaining portions of the second dielectric layer 20, the dielectric fill 6, and the native oxide 4 that is present on the fin structures 5a, 5b.

The remaining portions of the second dielectric layer 20 and the conformal first dielectric layer 15 provide a dielectric spacer 25a, 25b that are present in the space between adjacent fin structures 5a, 5b. In some embodiments, the dielectric spacer 25a, 25b may be self-aligned to the middle of the pitch dimension separating adjacent fin structures 5a, 5b. This self-alignment can result from the dual dielectric deposition process described with reference to FIGS. 2-5. The conformal first dielectric layer 15 is deposited to the same thickness on each of the fin structures 5a, 5b, as depicted in FIG. 2. The second dielectric layer 20 is deposited filling the space between the adjacent fin structures 5a, 5b, as depicted in FIG. 3. Because the conformal first dielectric layer 15 has the same thickness dimension on all the surfaces on which it is deposited, and the second conformal layer 20 fills the openings, regardless of the pitch separating the adjacent fin structures, the dielectric spacers 25a, 25b will always be centrally positioned in the openings. This is because the upper layer of the dielectric spacer 25a, 25b is provided by the second dielectric layer 20, while the space between the dielectric spacer 25a, 25b is provided by removing the conformal first dielectric layer 15 from the space between the sidewall of the fin structures 5a, 5b and the fill of the second dielectric layer 20. Because the conformal first dielectric layer 15 has the same thickness on the surfaces on which it is deposited, the space between the fin structures 15 and the dielectric spacer 25a, 25b will be the same for each of the dielectric spacers 25a, 25b.

As depicted in FIG. 2, the greater the pitch separating the adjacent fin structures 15, the greater the width of the dielectric spacer 25a, 25b. For example, the dielectric spacer identified by reference number 25b that is formed in the larger pitch between adjacent fin structures 15 is greater in width that than the dielectric spacer identified by reference number 25a that is formed in the lesser pitch between adjacent fin structures 15. In some embodiments, the width of the dielectric spacer 25a, 25b may range from 3 nm to 90 nm. In another embodiment, the width of the dielectric spacers 25a, 25b may range from 5 nm to 30 nm.

Figure 6:
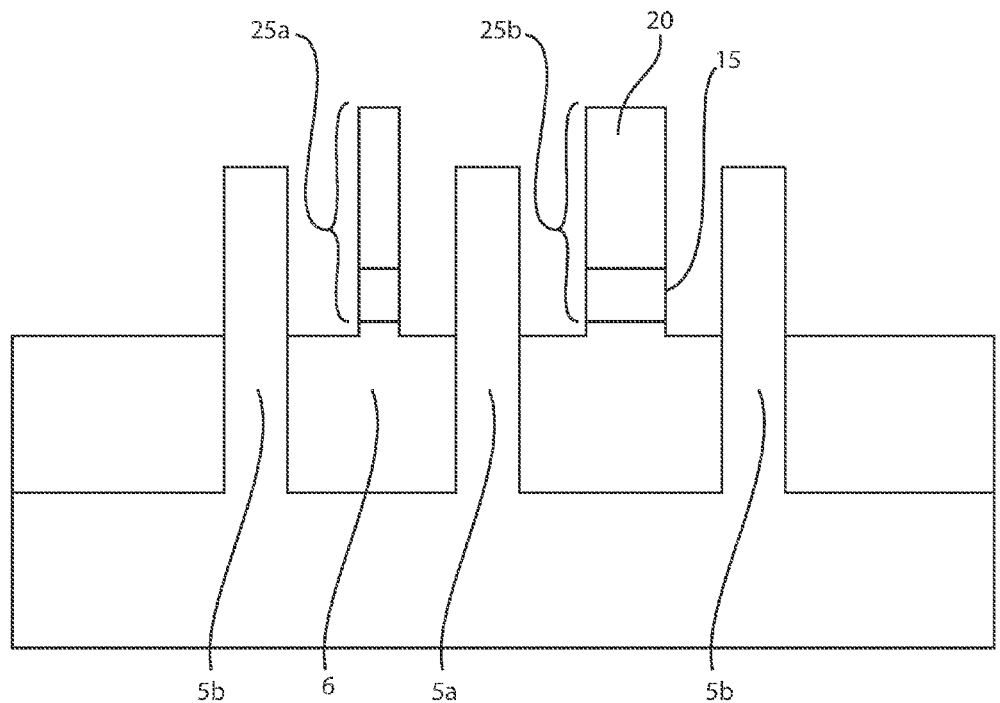
FIG. 6 is a side cross-sectional view of a pre-clean process for removing native dielectrics from the fin structures.

FIG. 6 depicts one embodiment of a pre-clean process for removing native dielectrics 4 from the surfaces of the fin structures 5a, 5b. In one embodiment the cleaning process may remove a native oxide material, such as silicon oxide or silicon oxynitride by the application of a solution of hydrofluoric acid. The hydrofluoric acid may be diluted with deionized (DI) water in order to slow down the etch rate of the silicon oxide, thereby ensuring better etch uniformity. In one embodiment, the dilution ratio ranges from 1:1 $HF:H_2O$ to 300:1 $H_2O:HF$. In another embodiment, the hydrofluoric acid may be diluted with ammonium fluoride ($NH_4F$). It is noted that this is only one example of a pre-clean process, and that any process may be used to provide a clean semiconductor surface for the following epitaxial growth process.

Following the pre-clean process, the space between the sidewall of the fin structure 5a, 5b and the neighboring dielectric spacer 25a, 25b may range from 3 nm to 50 nm. In another embodiment, the space between the sidewall of the fin structure 5a, 5b and the neighboring dielectric spacer 25a, 25b may range from 8 nm to 15 nm.

Figure 7:
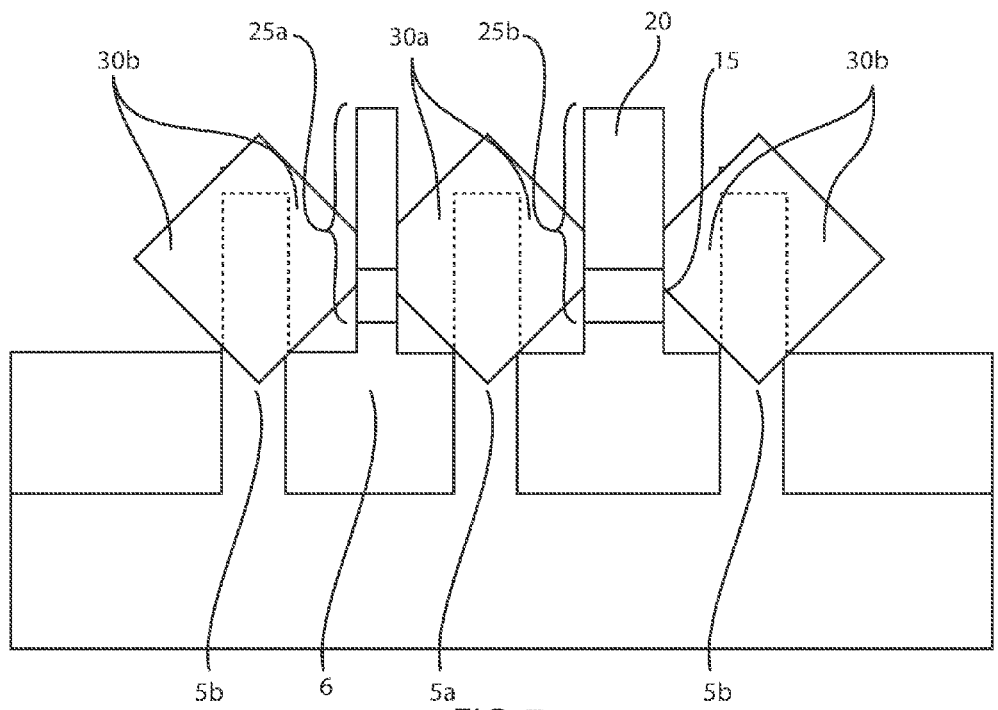
FIG. 7 is a side cross-sectional view depicting one embodiment of semiconductor material being epitaxially formed on the sidewalls of the adjacent semiconductor fin structures, wherein the dielectric spacer obstructs a first portion of epitaxial semiconductor material formed on a first fin structure of the adjacent semiconductor fin structures from merging with a second portion of epitaxial semiconductor material formed on a second sidewall of a fin structure of the adjacent fin structures.

FIG. 7 depicts one embodiment of semiconductor material being epitaxially formed on the sidewalls of the adjacent semiconductor fin structures 5a, 5b. In the embodiment that is depicted in FIG. 7, the dielectric spacers 25a, 25b obstruct a first portion of epitaxial semiconductor material 30a formed on a first sidewall S1 of a first fin structure 5a of the adjacent semiconductor fin structures from merging with a second portion of epitaxial semiconductor material 30b formed on a second sidewall S2 of a second fin structure 5b of the adjacent fin structures 5a, 5b.

The epitaxial semiconductor material 30a, 30b may provide a portion of the source and drain regions of a Fin type Field Effect Transistor (FinFET). In this example, the epitaxial semiconductor material 30a, 30b may be formed on the source and drain region portions of the fin structures 5a, 5b, which are on opposing sides of the channel portion of the fin structure 5a, 5b that the gate structure is present on.

The epitaxial semiconductor material 30a, 30b is typically epitaxially grown/deposited. In some embodiments, epitaxial deposition of the undoped epitaxial semiconductor material 6a, 6b is a selective deposition process. For example, although the epitaxial semiconductor material 30a, 30b orientates to the crystal arrangement of a semiconductor material and is deposited thereon, such as the exposed sidewall surfaces S1, S2 of the fin structures 5a, 5b, the epitaxial semiconductor material 30a, 30b may not be directly deposited on a dielectric material, such as the dielectric spacers 25a, 25b. The epitaxial semiconductor material 30a, 30b is initially deposited on exposed semiconductor surfaces of the fin structures 5, and grows from those surfaces with increasing deposition time. The dielectric spacers 25a, 25b are positioned in the space between the adjacent fin structures 5a, 5b, wherein the epitaxial material 30a, 30b is not grown on the dielectric spacers 25a, 25b, and the dielectric spacers 25a, 25b physically block the epitaxial semiconductor material that is deposited and grown on one fin structure, e.g., the fin structure identified by reference number 5a, from contacting and merging with epitaxial semiconductor material that is deposited and grown on an adjacent fin structure, e.g., the fin structure identified by reference number 5b.

In some embodiments, the epitaxial semiconductor material 30a, 30b may be composed of silicon (Si), germanium (Ge), silicon germanium (SiGe), silicon doped with carbon (Si:C) or the epitaxial semiconductor material 30a, 30b may be composed of a type III-V compound semiconductor, such as gallium arsenide (GaAs). For example, when the semiconductor device, e.g., FinFETs, being formed are p-type and the fin structures 5a, 5b are composed of silicon (Si), the source and drain regions may be doped to a p-type conductivity, and the material of the epitaxial semiconductor material 30a, 30b may be a germanium containing material, such as silicon germanium (SiGe). In other examples, when the semiconductor device, e.g., FinFETs, being formed are n-type and the fin structures 5a, 5b are composed of silicon (Si), the source and drain regions may be doped to an n-type conductivity, and the material of the epitaxial semiconductor material 30a, 30b may be silicon (Si) or silicon doped with carbon (Si:C). It is noted that the fin structures 5a, 5b may be independently processed to processed to provide both n-type and p-type semiconductor devices on a single semiconductor substrate. Independent processing of groups of fin structures may be provided using block masks, e.g., photoresist mask. More specifically, a first group of fin structures may be protected by a first photoresist block mask, while as second group of fin structures are processed to provide a first conductivity type device. Thereafter, the first photoresist block mask is removed from the first group of fin structures, and a second photoresist block mask is formed over the second group of fin structures. Following formation of the second photoresist block mask, the first group of fin structures may be processed to provide another conductivity type semiconductor device.

In one embodiment, a number of different sources may be used for the epitaxial deposition of the epitaxial semiconductor material 30a, 30b. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material 6a, 6b of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition may result in crystal defects and film cracking. In one embodiment, the thickness of epitaxial semiconductor material 30a, 30b may range from 10 nm to 100 nm In another embodiment, the thickness of epitaxial semiconductor material 30a, 30b may range from 40 nm to 60 nm.

The epitaxial semiconductor material 30a, 30b may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses.

In the embodiments in which the finFET device being formed has n-type source and drain regions, and is referred to as an n-type finFET, the doped epitaxial semiconductor material 30a, 30b is doped with an n-type dopant to have an n-type conductivity. In the embodiments in which the finFET device being formed has p-type source and drain regions, and is referred to as a p-type finFET, the doped epitaxial semiconductor material 30a, 30b is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$).

Referring to FIG. 7, although the first and second epitaxial semiconductor material 30a, 30b positioned between adjacently positioned fin structures 5a, 5b, i.e., neighboring fin structures 5a, 5b, is depicted as being in direct contact with the dielectric spacers 25a, 25b, which obstruct the formation of merged epitaxial material, it is not required that each of the first and second epitaxial semiconductor material 30a, 30b directly contact the dielectric spacers 25a, 25b.

In one embodiment, dopant from the doped epitaxial semiconductor material 30a, 30b is diffused into the fin structures 5 to form an extension dopant region extending into the fin structure 5a, 5b. In some embodiments, the diffusion, i.e., driving, of the dopant from the doped epitaxial semiconductor material 30a, 30b into the extension region portions of the fin structures 5a, 5b comprises thermal annealing. In one embodiment, the thermal annealing that diffuses the dopant from the doped epitaxial semiconductor material 30a, 30b into the extension region portions of the fin structures 5a, 5b includes an annealing process selected from the group consisting of rapid thermal annealing (RTA), flash lamp annealing, furnace annealing, laser annealing and combinations thereof. In one embodiment, the thermal annealing for driving the dopant, i.e., p-type or n-type dopant, from doped epitaxial semiconductor material 30a, 30b into the extension region portions of the fin structures 5a, 5b may include a temperature ranging from 800° C. to 1200° C., and a time period ranging from 10 milliseconds to 100 seconds. The source and drain regions of the fin field effect transistors (FinFETs) may be provided by a combination of the doped epitaxial semiconductor material 30a, 30b and the extension regions of diffused dopant in the source and drain region portions of the fin structures 5a, 5b.

It is noted that the above process sequence describes a gate first process sequence for forming FinFETs. The present disclosure is not limited to only gate first processing. For example, gate last, which is also referred to as replacement gate processing, is also suitable for use with the methods and structures of the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

Figure 8:
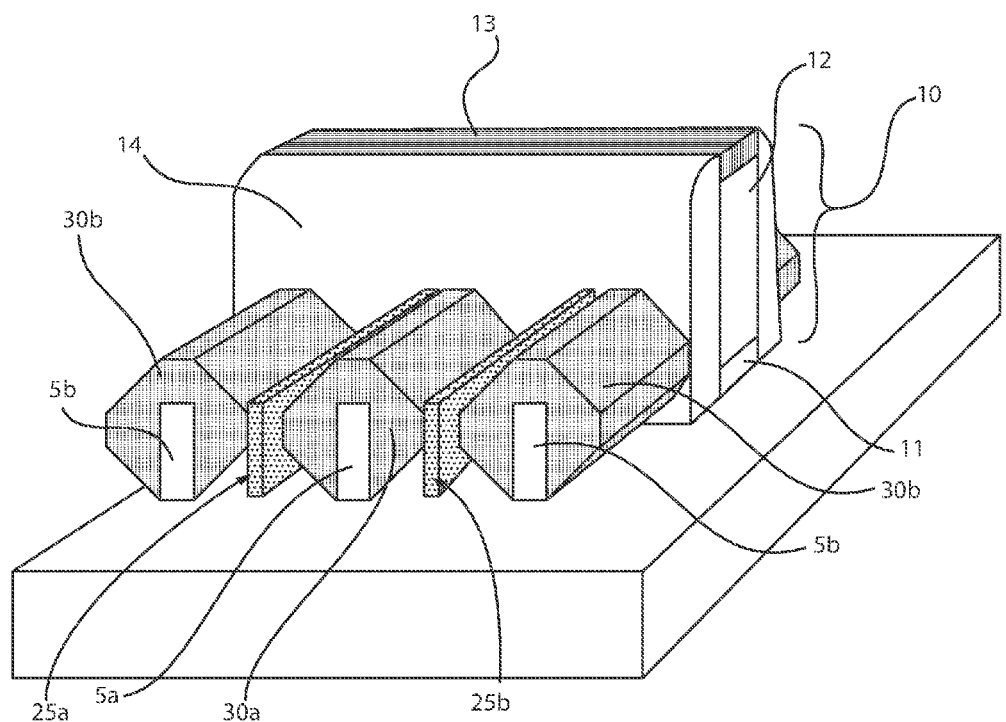
FIG. 8 is a perspective view of a Fin type Field Effect Transistor (FinFET) including the epitaxial semiconductor material that is depicted in FIG. 7, in accordance with one embodiment of the present disclosure.

FIG. 8 depicts one embodiment of a Fin type Field Effect Transistor (FinFET) including the epitaxial semiconductor material that is depicted in FIG. 7. In some embodiments, a dielectric spacer 25a, 25b is present within the space between adjacent fin structures 5a, 5b. A first portion of epitaxial semiconductor 30a is present on a first sidewall of a first fin structure 5a of the adjacent fin structures, and a second portion of epitaxial semiconductor material 30b is present on a second sidewall of a second fin structure 5b of the adjacent fins structures 5a, 5b. The epitaxial semiconductor material 30a, 30b that is in contact with the first and second fin structures of the adjacent fin structures 5a, 5b may also contact that dielectric spacer 25a, 25b that obstructs a first portion of epitaxial semiconductor material 30a from merging with the second portion of epitaxial semiconductor material 30b. The epitaxial semiconductor material provides a source region and drain regions for the FinFETs. A gate structure 10 is present between the source region and the drain region and includes a gate dielectric 11, a gate electrode 12, and a gate cap 13. Gate sidewall spacer 14 may be present on the sidewalls of the gate structure 10.

FIGS. 9-20 depict another embodiment of the present disclosure. In the embodiment that is depicted in FIGS. 9-20, the width of the epitaxial material formed on the exterior sidewalls of perimeter fin structures in a plurality of fin structures may be controlled using dielectric spacers 50a, 50b.

Figure 9:
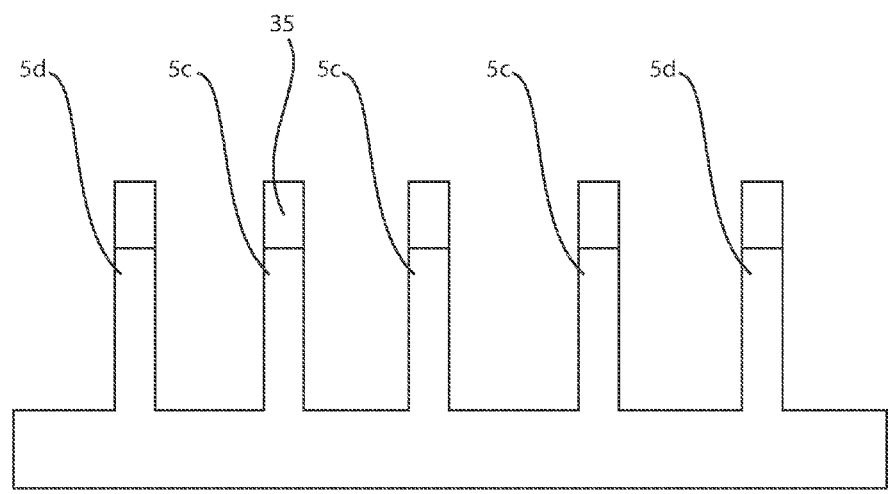
FIG. 9 is a top-down view of a plurality of fin structures, in accordance with another embodiment of the present disclosure.

FIG. 9 depicts one embodiment of forming a plurality of semiconductor fin structures 5c, 5d from a bulk semiconductor substrate. In the example depicted in FIG. 9, the fin structures are formed using a hardmask 35. More specifically, a hardmask dielectric layer is formed atop a substrate. The hardmask dielectric layer may be composed of an oxide, such as silicon oxide, or a nitride, such as silicon nitride. Following formation of the hardmask dielectric layer, the layer is patterned using photolithography and etching to provide the hardmask 35. The hardmask 35 is then used to pattern the underlying semiconductor substrate utilizing an anisotropic etch, such as reactive ion etch to form the plurality of semiconductor fin structures 5c, 5d. The semiconductor fin structures 5c, 5d depicted in FIG. 9 are similar to the fin structures 5a, 5b that are depicted in FIGS. 1A and 1B. Therefore, the description of the composition and geometry of the fin structures 5a, 5b depicted in FIGS. 1A and 1B is suitable for some embodiments of the semiconductor fin structures 5c, 5d depicted in FIG. 9.

Figure 10:
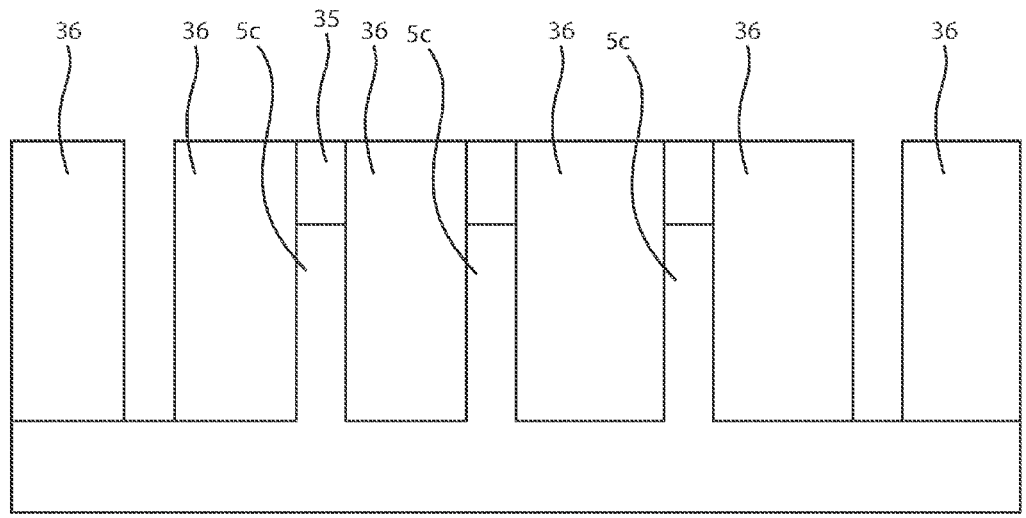
FIG. 10 is a side cross-sectional view depicting forming a dielectric fill material on the fin structures depicted in FIG. 9, and removing fin structures at the perimeter of the structure.

FIG. 10 depicts one embodiment of forming a fill dielectric material 36 in the space separating the adjacent fin structures 5c, 5d depicted in FIGS. 9A-9B. The fill dielectric layer 36 may be composed of any fill dielectric material including oxides and nitrides. For example, the fill dielectric material 36 may be composed of silicon oxide, silicon nitride or may be a low-k polymeric material, e.g., a polymeric material having a room temperature dielectric constant less than silicon oxide, i.e., a dielectric constant less than 4.0. The fill dielectric material 36 may be deposited using any deposition process that can fill the space between the adjacent semiconductor fin structures 5a, 5b. For example, the fill dielectric material 36 can be deposited using chemical vapor deposition, e.g., plasma enhanced chemical vapor deposition (PECVD), spin on deposition, physical vapor deposition, chemical solution deposition, and combinations thereof.

In some embodiments, following deposition of the fill dielectric material 36 filling the space between the adjacent semiconductor fin structures 5c, 5d, a planarization process may be applied so that the upper surface of the fill dielectric material is coplanar with the upper surface of the hard mask 35 atop the semiconductor fin structures 5c, 5d. The planarization process may be chemical mechanical planarization.

FIG. 10 further depicts removing the perimeter semiconductor fin structures identified by reference number 5d depicted in FIG. 9. The perimeter semiconductor fin structures may be removed by an etch process. For example, the perimeter semiconductor fin structures may be removed by an etch process that is selective to the fill dielectric material 36, and the composition of the bulk substrate. The etch process may be accompanied by forming an etch mask, e.g., photoresist mask, over the fin structures identified by reference number 5c, which can be processed to provide fin containing semiconductor devices, such as FinFETs.

Figure 11:
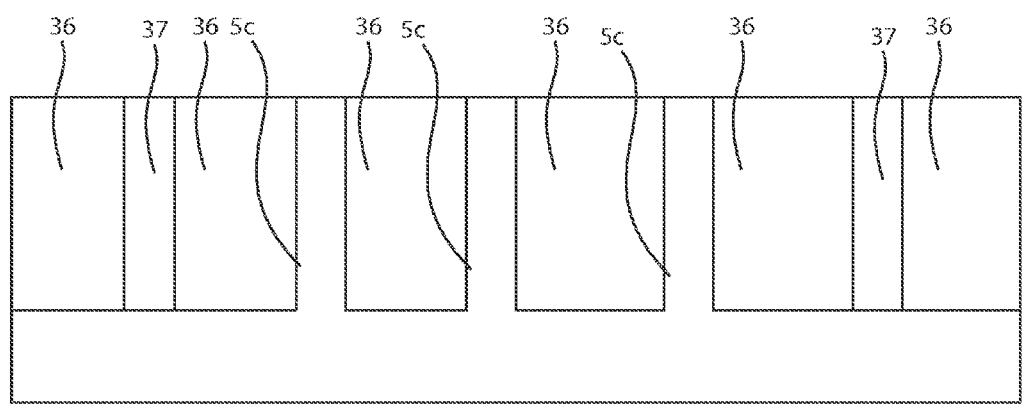
FIG. 11 is a side cross-sectional view depicted forming a dielectric dummy fin in the openings created by removing the perimeter fins described in FIG. 10, in accordance with one embodiment of the present disclosure.

FIG. 11 depicts forming a dielectric dummy fin structures 37 in the openings created by removing the perimeter fin structures. The dielectric dummy fin structures 37 may be composed of any dielectric material, such as oxides, e.g., silicon oxide ($SiO_2$), silicon nitride ($Si_3N_4$) and combinations thereof. The dielectric dummy fin structures 37 may be formed using any deposition process that may fill the openings, such as chemical vapor deposition, e.g., plasma enhanced chemical vapor deposition (PECVD), spin on deposition, physical vapor deposition, chemical solution deposition, and combinations thereof. Following deposition of the material for the dielectric dummy fin structures 27, a planarization process, such as chemical mechanical planarization, may be applied to provide that the upper surface of the dielectric dummy fin structures 37 is coplanar with the upper surface of the dielectric fill material and the upper surface of the fin structures 5c. The hardmask 35 may be removed during this step of the process sequence.

Figure 12A:
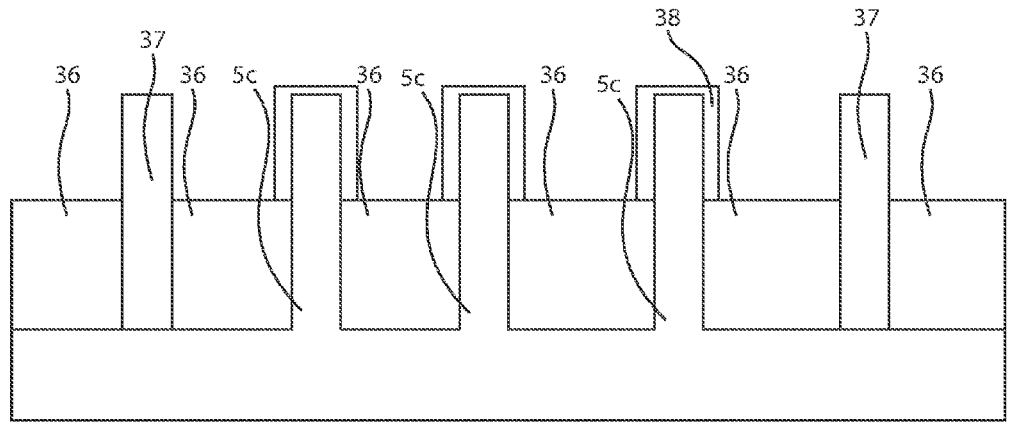
FIG. 12A is a side-cross sectional view depicting recessing the dielectric fill material.

FIG. 12A depicts recessing the dielectric fill material 36. The dielectric fill material 36 may be recessed by an etch process that is selective to the dielectric dummy fin structures 37 and the fin structures 5c. In some embodiments, the dielectric fill material 36 is recessed by reactive ion etch (RIE). The depth that the dielectric fill material 36 is recessed dictates the height of the fin structures.

Still referring to FIG. 12A, following recessing of the dielectric fill material 36, a native dielectric 38 may be formed on the exposed surfaces of the fin structures 5c. The native dielectric 38 may be formed using thermal growth processes, such as thermal oxidation. In some embodiments, the native dielectric 38 may be composed of silicon oxide. The native dielectric depicted in FIG. 12 is similar to the native dielectric 4 that is described above with reference to FIG. 1B. Therefore, further details regarding the native dielectric 38 depicted in FIG. 12 are found above in the description of the native dielectric 4 depicted in FIG. 1B.

Figure 12B:
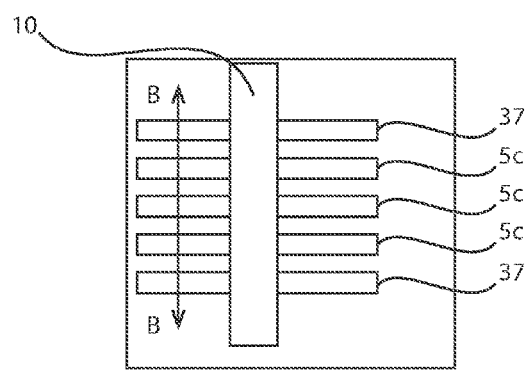
FIG. 12B is top down view along of the structure depicted in FIG. 12A, wherein the cross-section depicted in FIG. 12A is along section line B-B of FIG. 12B.

FIG. 12B depicts forming a gate structure 10 on the channel portion of the fin structures 5C. The gate structure 10 has been described above with reference to FIGS. 1 and 2, as well as FIG. 8.

Figure 13:
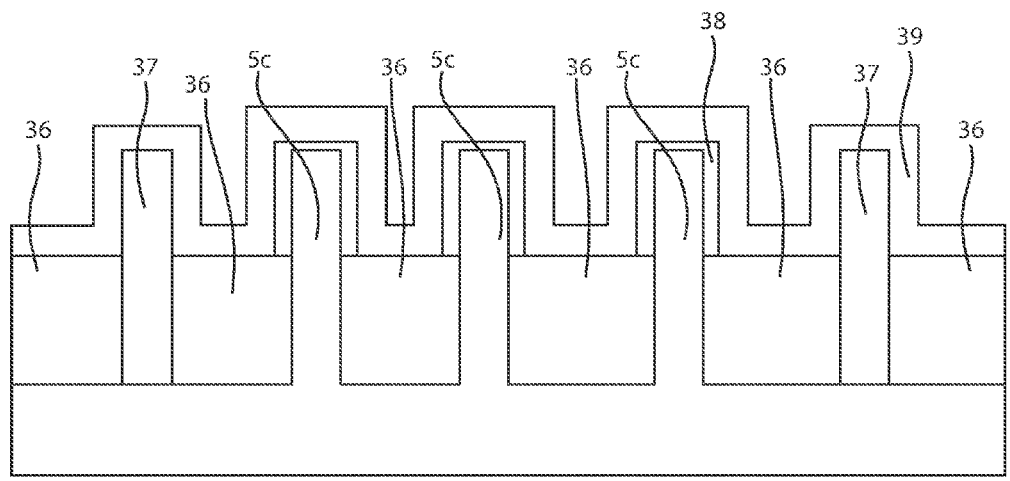
FIG. 13 is a side cross-sectional view depicting depositing a conformal first dielectric layer, in accordance to one embodiment of the present disclosure.

FIG. 13 depicting depositing a conformal first dielectric layer 39 for forming the dielectric spacer 50a between the adjacent semiconductor fin structures 5c. In this embodiment, the conformal first dielectric layer 39 also provides a portion of a dielectric spacer 50b for controlling the width of epitaxial semiconductor material that is formed on exterior sidewalls of perimeter fin structures that are present in a plurality of semiconductor fin structures 5c. The conformal first dielectric layer 39 is formed on the sidewall and upper surfaces of the dummy dielectric fin structures 37 and the semiconductor fin structures 5c. The conformal first dielectric layer 39 is also formed on the upper surfaces of the recessed dielectric fill material 36. The thickness of the conformal first dielectric layer 39 is substantially equal on the sidewalls of the dielectric dummy fin structures 37, the upper surface of the dielectric dummy fin structures 37, the upper surface of the dielectric fill material 36, the sidewalls of the semiconductor fin structure 5c and the upper surface of the semiconductor fin structure 5c.

The conformal first dielectric layer 39 is similar to the conformal first dielectric layer 15 that has been described above with reference to FIG. 2. Therefore, the description of the conformal first dielectric layer 15 depicted in FIG. 2 including the description of the composition and the geometry of the conformal first dielectric layer 15 is suitable for the description of the conformal first dielectric layer 39 that is depicted in FIG. 13. For example, the conformal first dielectric layer 39 may be composed of any dielectric layer that can be etched selectively to a later formed second dielectric layer 40 that also contributes to the formation of the dielectric spacers 50a, 50b that control the width of the epitaxial semiconductor material that is formed on the semiconductor fin structures 5c.

Figure 14:
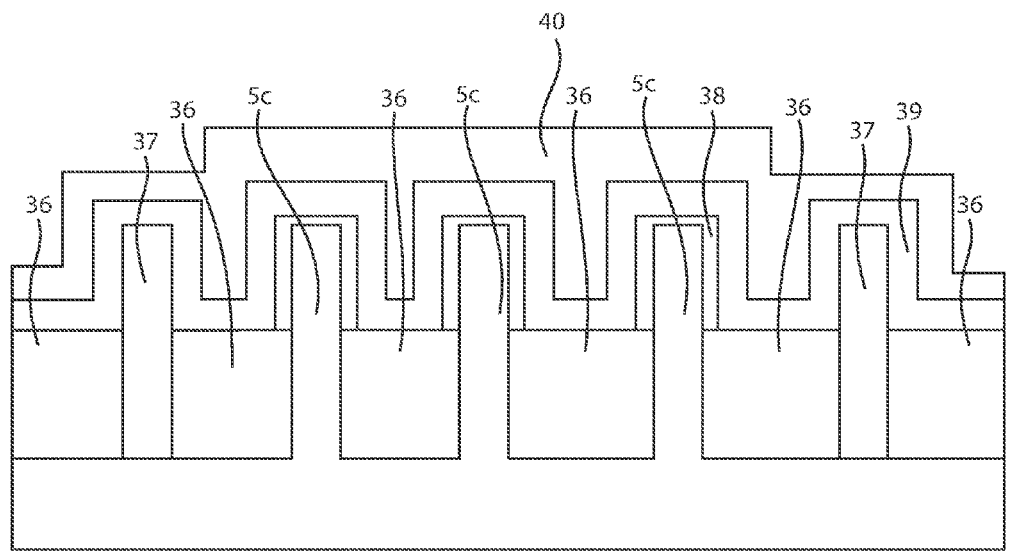
FIG. 14 is a side cross-sectional view depicting forming a second dielectric layer on the conformal first dielectric layer of FIG. 13, in which the second dielectric layer can pinch off, i.e., can fill, the space between the adjacent fins structures, in accordance with one embodiment of the present disclosure.

FIG. 14 is a side cross-sectional view depicting forming a second dielectric layer 40 on the conformal first dielectric layer 39 of FIG. 13, in which the second dielectric layer 40 can pinch off, i.e., can fill, the space between the adjacent semiconductor fin structures 5c and the space between the semiconductor fin structures 5c and the dummy dielectric fin structures 37. The second dielectric layer 40 is deposited atop the conformal first dielectric layer 39 overlying the sidewalls of the dummy dielectric fin structures 37; the upper surface of the dummy dielectric fin structures 37; the upper surfaces of the dielectric fill material 36 between adjacent semiconductor fin structures 5c and dummy dielectric fin structures 37; the sidewalls of the semiconductor fin structures 5c; and the upper surface of the dielectric fin structures 5c.

The second dielectric layer 40 that is depicted in FIG. 14 is similar to the second dielectric layer 20 that is depicted in FIG. 3. Therefore, the description of the second dielectric layer 20 that is depicted in FIG. 3 is suitable to describe at least one embodiment of the second dielectric layer 40 that is depicted in FIG. 14. Similar to the second dielectric layer 20 that is depicted in FIG. 3, the second dielectric layer 40 that is depicted in FIG. 14 is deposited using a deposition process to fill the spaces between the adjacent semiconductor fin structures 5c. In the embodiment depicted in FIG. 14, the second dielectric layer 40 is also deposited to fill the space between the dielectric dummy fin structures and the perimeter semiconductor fin structures 5c. Similar to the second dielectric layer 20 depicted in FIG. 3, the second dielectric layer 40 that is depicted in FIG. 14 may be composed of any dielectric layer that can be etched selectively to the conformal first dielectric layer 39 that also contributes to the formation of the dielectric spacers 50a, 50b that control the width of the epitaxial semiconductor material that is formed on the semiconductor fin structures 5c.

Figure 15:
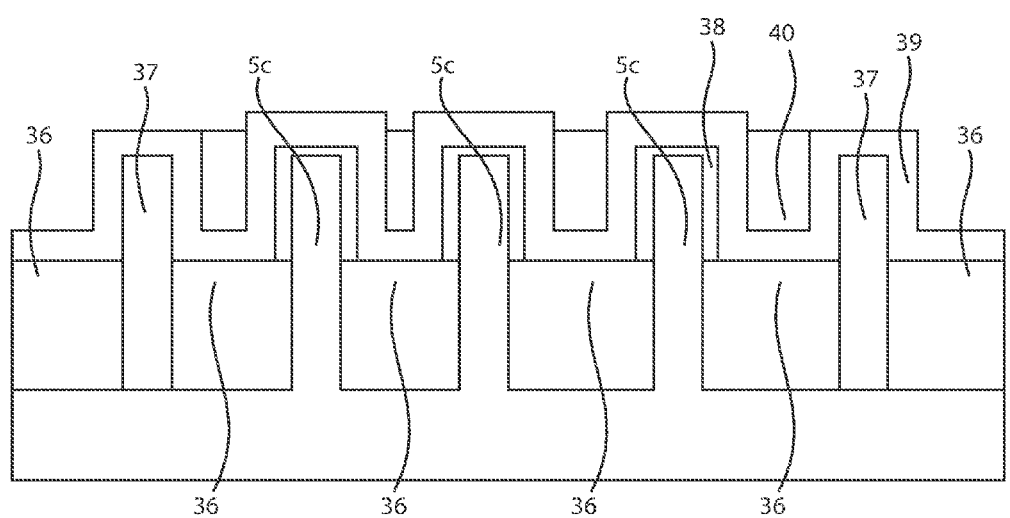
FIG. 15 is a side cross-sectional view depicting isotropically etching the second dielectric layers to recess the second dielectric layer in the space that is present between adjacent fin structures, in accordance with one embodiment of the present disclosure.

FIG. 15 depicts isotropically etching the second dielectric layer 40 to recess the second dielectric layer 40 in the space that is present between adjacent semiconductor fin structures 5c and the space between the perimeter semiconductor fin structures 5c and the dielectric dummy fin structure 37. In some embodiments, the isotropic etch process that is employed at this stage of the process flow is a plasma etch, gas phase etch, or wet chemical etch. In some embodiments, the isotropic etch removes the portions of second dielectric layer 40 that are overlying the semiconductor fin structures 5c and dielectric dummy fin structures 37 to expose the portions of the conformal first dielectric layer 39 that are present on the upper surfaces of the semiconductor fin structures 5c and the dielectric dummy fin structure 37. The isotropic etch may also remove the portions of the second dielectric layer 40 that are present on the outer sidewalls of the perimeter semiconductor fin structures 5c. Following the isotropic etch, the remaining portion of the second dielectric layer 40 is present only in the space separating the adjacent fin structures 5c atop the conformal first dielectric layer 39, and the space separating the perimeter semiconductor fin structures 5c from the dummy dielectric fin structures 37.

Although the second dielectric layer 40 may be recessed within the openings separating the adjacent fin structures 5c and the space between the semiconductor fin structures 5c and the dielectric dummy fin structures 37, the majority of the second dielectric layer 40 that was present between the adjacent fin structures 5c, as well as the majority of the second dielectric layer 40 that was present between the semiconductor fin structures 5c and the dielectric dummy fin structure 37, prior to the isotropic etch remains following the isotropic etch. As will be further explained below, the remaining portion of the second dielectric layer 40 provides the upper layer of the dielectric fins 50a, 50b that is employed to control epitaxial merging.

The isotropic etch typically includes an etch chemistry that removes the second dielectric layer 20 selectively to the conformal first dielectric layer 15. In some embodiments, etch selectivity may be aided with the use of etch masks, such as photoresist masks.

Figure 16:
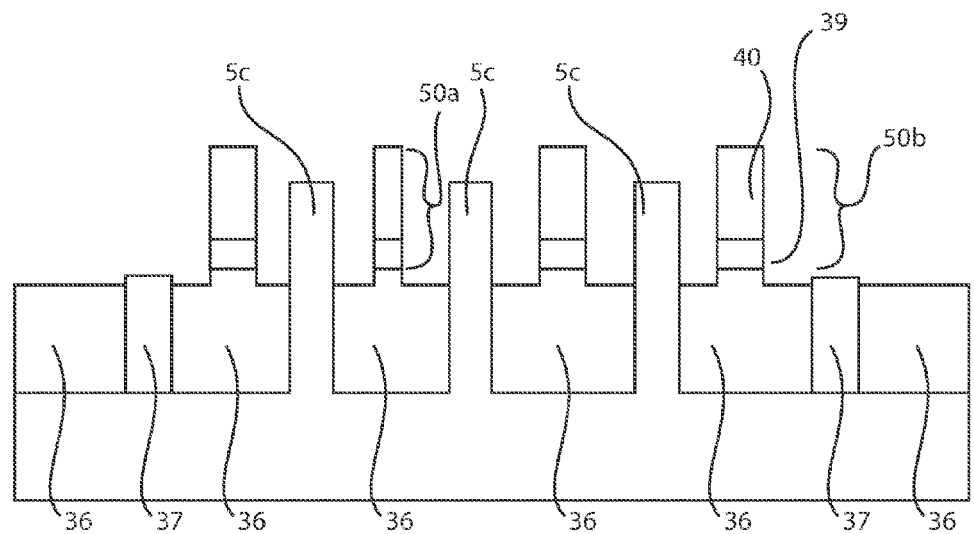
FIG. 16 is a side cross-sectional view depicting an anisotropic etch step for removing vertical portion of the conformal first dielectric layer from the structure depicted in FIG. 15, in accordance with one embodiment of the present disclosure

FIG. 16 depicts one embodiment of an anisotropic etch process for removing vertical portions of the first dielectric layer 39. During this etch step, the remaining portion of the second dielectric layer 40 may function as an etch mask to protect the directly underlying portion of the first dielectric layer 39. The anisotropic etch process for removing the vertical portions of the first dielectric layer 39 may be a reactive ion etch (RIE) process. Other examples of anisotropic etching that can be used at this point of the present invention include ion beam etching, plasma etching or laser ablation. The anisotropic etch process may also remove the material of the conformal first dielectric layer 39 selectively to the remaining portions of the second dielectric layer 40, the dielectric fill 36, and the native oxide 38 that is present on the fin structures 5c.

In some embodiments, the anisotropic etch process for removing the vertical portions, i.e., exposed portions, of the first dielectric layer 39 also remove at least a portion of the dielectric dummy fin structures 37. In some embodiments, the dummy fin structures 50a, 50b may be recessed to a portion of their original height, e.g., a quarter of their original height, or the dielectric dummy fin structures 37 may be removed in their entirety.

The remaining portions of the second dielectric layer 40 and the conformal first dielectric layer 39 provide the dielectric spacers 50a, 50b that are present in the space between adjacent fin structures 5c, and outside the perimeter semiconductor fin structures 5c for controlling the width of epitaxial semiconductor material that is formed on the outside sidewalls of the perimeter semiconductor fin structures 5c. In some embodiments, the dielectric spacer 25a, 25b may be self-aligned to the middle of the pitch dimension separating adjacent semiconductor fin structures 5c. This self-alignment can result from the dual dielectric deposition process described with reference to FIGS. 13-16. The self-alignment provided by the methods described with reference to FIGS. 13-16 is similar to the self-alignment phenomena that has been described with reference to FIGS. 2-5. For example, the greater the pitch separating the adjacent semiconductor fin structures 5c, the greater the width of the dielectric spacer 50a between the adjacent fin structures 5c.

In some embodiments, the width of the dielectric spacer 50a, 50b may range from 3 nm to 90 nm. In another embodiments, the width of the dielectric spacers 50a, 50b may range from 5 nm to 30 nm.

The dielectric spacer 50b that is positioned outside the perimeter semiconductor fin structures 5c may be separated from the outside sidewall of the perimeter semiconductor fin structures 5c by a dimension ranging from 3 nm to 50 nm. In another embodiment, the dielectric spacer 50b that is positioned outside the perimeter semiconductor fin structures 5c may be separated from the outside sidewall of the perimeter semiconductor fin structures 5c by a dimension ranging from 5 nm to 15 nm.

Figure 17:
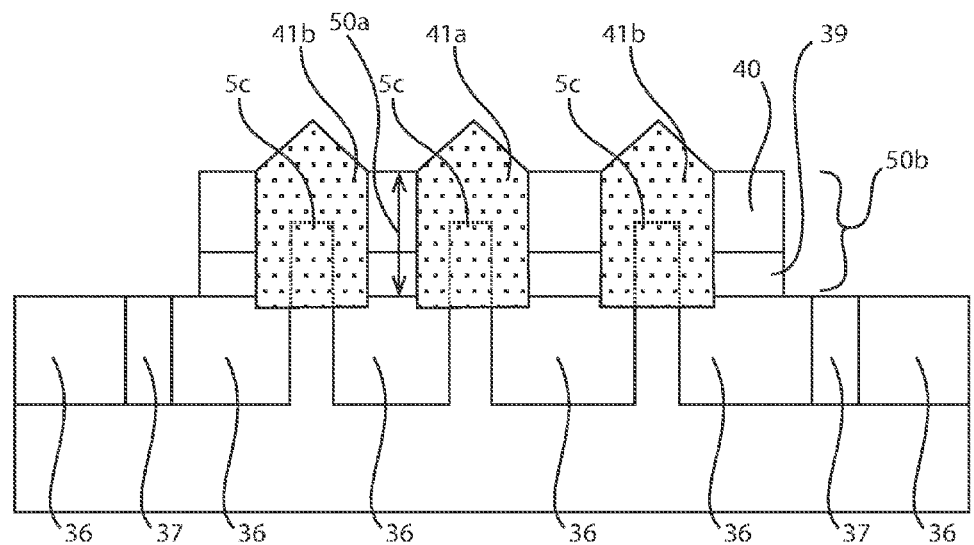
FIG. 17 is a side cross-sectional view depicting one embodiment of a semiconductor material being epitaxially formed on the sidewalls of the adjacent semiconductor fin structures depicted in FIG. 16, wherein the dielectric spacer obstructs the epitaxial semiconductor material being grown on the sidewalls of the fin structures from merging, in accordance with the present disclosure.

FIG. 17 depicts one embodiment of a semiconductor material 41a, 41b being epitaxially formed on the sidewalls of the adjacent semiconductor fin structures 5c and perimeter semiconductor fin structures 5c depicted in FIG. 16. The dielectric spacer 50a that is positioned between the adjacent semiconductor fin structures 5c obstructs the epitaxial semiconductor material 41a, 41b being grown on the sidewalls of the fin structures 5c from merging. The dielectric spacer 50b that is positioned outside the perimeter of the semiconductor fin structures 5c can obstruct the epitaxial semiconductor material 41b that is formed on the outside sidewalls of the perimeter semiconductor fin structures 5c from growing beyond a preselected width W5.

The epitaxial semiconductor material 41a, 41b that is depicted in FIG. 17 is similar to the epitaxial semiconductor material 30a, 30b that is depicted in FIG. 7. For example, the epitaxial semiconductor material 41a, 41b can provides a portion of the source and drain regions of semiconductor devices that employ the semiconductor fin structures 5c to house the channel region of a field effect transistor, e.g., in a FinFET arrangement, in which the source and drain regions are on opposing sides of the channel region of the semiconductor fin structures 5c. Therefore, the description of the epitaxial semiconductor material 30a, 30b that is depicted in FIG. 7 including its composition, and method of formation, as well as its use in providing source and drain regions is suitable for the description of the epitaxial semiconductor material 41a, 41b that is depicted in FIG. 17.

Figure 18:
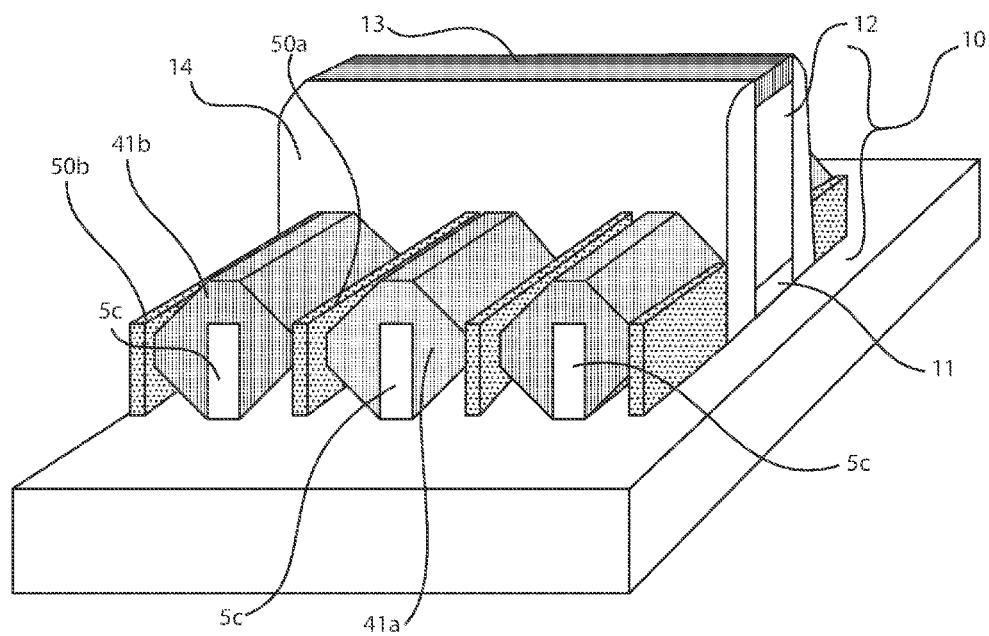
FIG. 18 is a perspective view of a Fin type Field Effect Transistor (FinFET) including the epitaxial semiconductor material that is depicted in FIG. 17, in accordance with one embodiment of the present disclosure.

FIG. 18 depicts one embodiment of a Fin type Field Effect Transistor (FinFET) including the epitaxial semiconductor material 41a, 41b that is depicted in FIG. 17. In some embodiments, a dielectric spacer 50a is present within the space between adjacent fin structures 5c. This dielectric spacer 50a may be employed to obstruct the formation of merged epitaxial material. In this embodiment, a dielectric spacer 50b is also present to the exterior of the perimeter semiconductor fin structures 5c for controlling the width of epitaxial semiconductor material 40b that is formed on exterior sidewalls of perimeter fin structures. The epitaxial semiconductor material 40a, 40b provides a source region and drain regions for the FinFETs. A gate structure 10 is present between the source region and the drain region and includes a gate dielectric 11, a gate electrode 12, and a gate cap 13. Gate sidewall spacer 14 may be present on the sidewalls of the gate structure 10.

Figure 19:
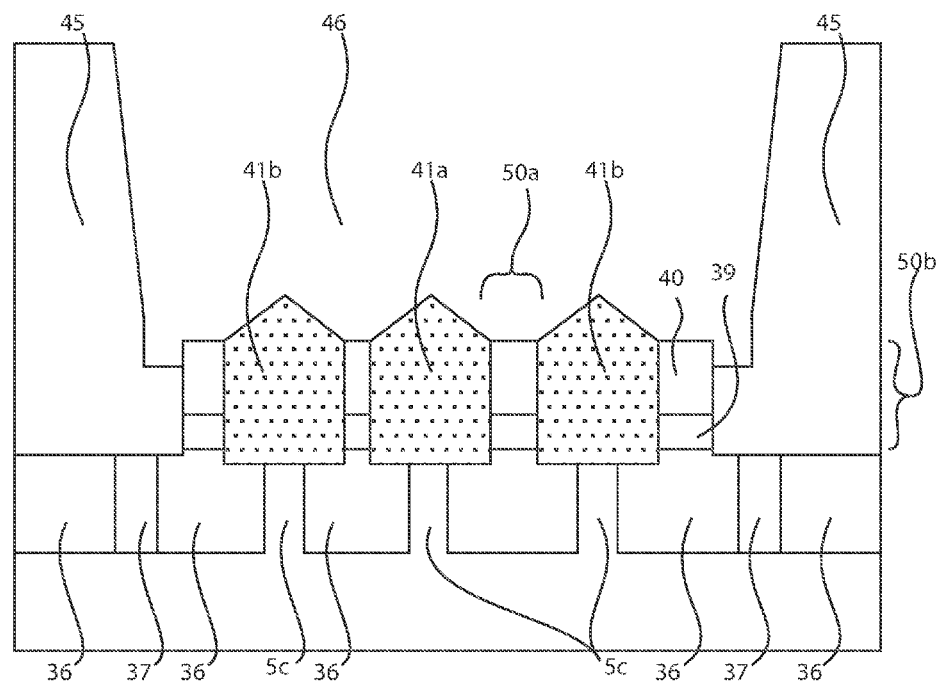
FIG. 19 is a side cross-sectional view depicting forming an opening through an interlevel dielectric to the epitaxial semiconductor material depicted in FIG. 17.

FIG. 19 depicts one embodiment of forming an opening through an interlevel dielectric 45 to the epitaxial semiconductor material 40a, 40b depicted in FIG. 17. The interlevel dielectric layers 45 may then be formed over the at least the semiconductor fin structures 5c, and related FinFETs components, using a deposition process, such as chemical vapor deposition (CVD), spin on deposition, chemical solution deposition or a combination thereof. Examples of materials that can provide the interlevel dielectric 435 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ), undoped silica glass, diamond like carbon (DLC), methylsilsesquioxane (MSQ) and combinations thereof.

Still referring to FIG. 19, an opening 46 may then be formed in the interlevel dielectric layer 45 to expose the epitaxial semiconductor material 40a, 40b and the semiconductor fin structures 5c. The opening 46 may be formed using deposition, photolithography and etch processes.

Figure 20:
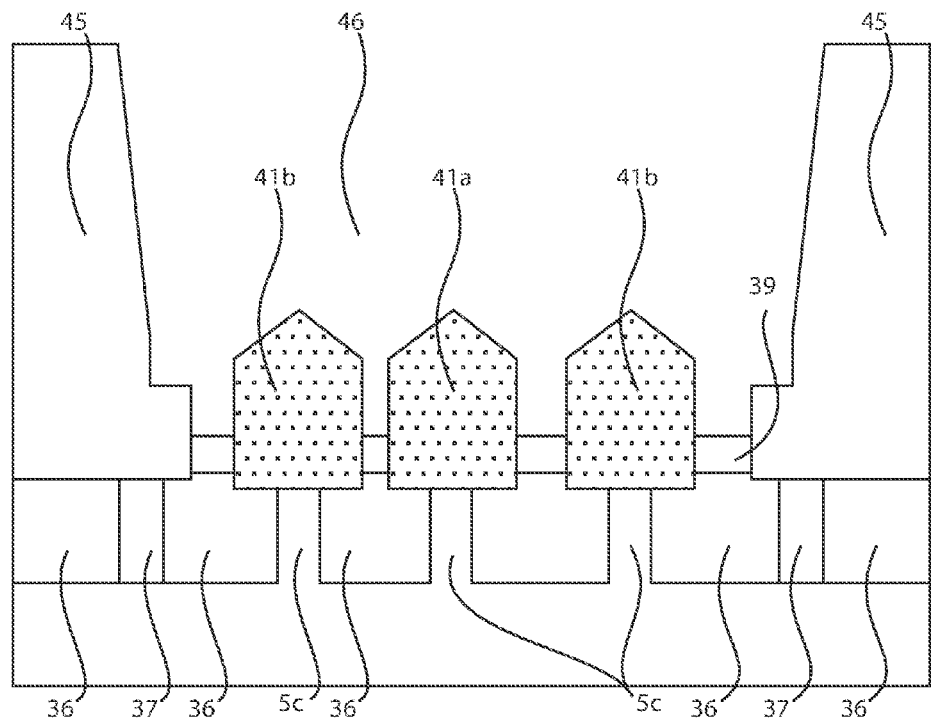
FIG. 20 is a side cross-sectional view depicting removing the second dielectric layer of the dielectric spacer.

FIG. 20 depicts removing the second dielectric layer 40 of the dielectric spacers 50a, 50b. The second dielectric layer 40 may be removed by a selective etch process, such as a wet chemical etch. The second dielectric layer 40 may also be removed by reactive ion etching. In some embodiments, the second dielectric layer 40 is removed by an etch process that is selective to the epitaxial semiconductor material layers 41a, 41b, the remaining portions of the conformal first dielectric layer 39, the semiconductor fin structures 5c, and the interlevel dielectric layer 45.

Figure 21:
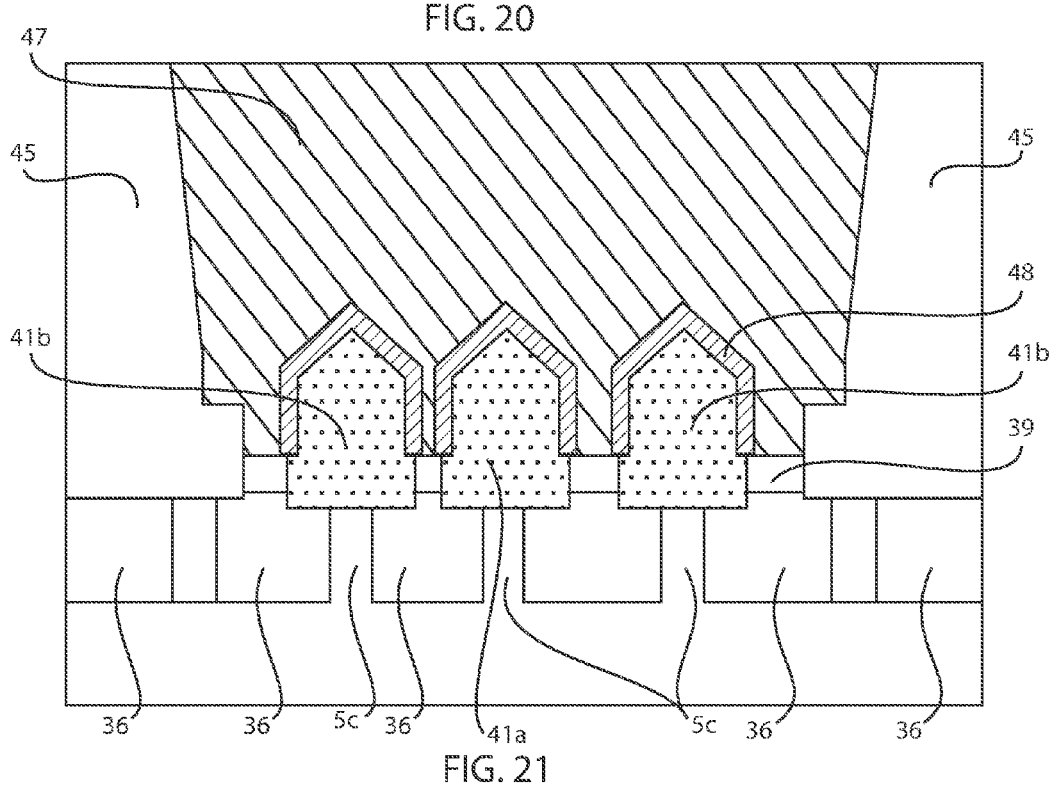
FIG. 21 is a side cross-sectional view depicting forming a contact to the epitaxial semiconductor material depicted in FIG. 20.

FIG. 21 depicting forming a contact 47 to the epitaxial semiconductor material 41a, 41b depicted in FIG. 20. The contact 47 may be formed by depositing an electrically conductive material within the opening 46. For example, a metal, such as aluminum (Al), copper (Cu), tungsten (W), platinum (Pt) or a combination thereof, may be deposited in the opening 46 using a physical vapor deposition process, such as plating, sputtering or a combination thereof. In some embodiments, a metal semiconductor alloy 48, e.g., silicide, may be formed at the interface of the contact 47 and the epitaxial semiconductor material 41a, 41b.

The methods and structures that have been described above with reference to FIGS. 1A-21 may be employed in any electrical device. For example, the metal vias and metal containing lines that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
   a plurality of fin structures;
   a dielectric spacer in a space between adjacent fin structures of said plurality of fin structures; and
   an epitaxial semiconductor present on a first sidewall of a first fin structure of the adjacent fin structures and a second sidewall of a second fin structure of the adjacent fins structures, wherein the epitaxial semiconductor material that is in contact with the first and second fin structures also contacts the dielectric spacer.

2. The semiconductor device of claim 1, wherein the epitaxial semiconductor present on the first fin structure is separate from the epitaxial semiconductor present on the second fin structure.

3. The semiconductor device of claim 1 wherein the epitaxial semiconductor material is present on source and drain region portions of the plurality of fin structures, and a gate structure is present on a channel region portion of the plurality of fin structures between the source and drain region portions.

4. The semiconductor device of claim 3, wherein the gate structure comprises a gate dielectric on the channel region portion and at least one gate conductor on the gate dielectric.

5. The semiconductor device of claim 1, wherein the dielectric spacer has a height that is less than a height of the plurality of fin structures.

6. The semiconductor device of claim 1, wherein the plurality of fin structures includes a first group of fin structures having a first pitch and a second group of fin structures having a second pitch.

7. The semiconductor device of claim 6, wherein the dielectric spacer is self-aligned to a central position of the first pitch and second pitch.

8. The semiconductor device of claim 7, wherein the first pitch is greater than the second pitch, and the dielectric spacer between adjacent semiconductor fin structures in the first group having the first pitch has a width that is greater than the dielectric spacer between adjacent semiconductor fin structures in the second group having the second pitch.

9. A semiconductor device comprising:
   a first group of fin structures having a first pitch and a second group of fin structures having a second pitch on a same substrate, wherein the first pitch is greater than the second pitch;
   a dielectric spacer in a space between adjacent fin structures that is self-aligned to a central position of the first pitch and second pitch, the dielectric spacer between adjacent semiconductor fin structures in the first group having the first pitch has a width that is greater than the dielectric spacer between adjacent semiconductor fin structures in the second group having the second pitch; and
   an epitaxial semiconductor present on a first sidewall of a first fin structure of the adjacent fin structures and a second sidewall of a second fin structure of the adjacent fins structures in the first and second group of fin structures, wherein the epitaxial semiconductor material that is in contact with the first and second fin structures also contacts the dielectric spacer.

10. The semiconductor device of claim 9, wherein the epitaxial semiconductor present on the first fin structure is separate from the epitaxial semiconductor present on the second fin structure.

11. The semiconductor device of claim 9 wherein the epitaxial semiconductor material is present on source and drain region portions of the plurality of fin structures, and a gate structure is present on a channel region portion of the plurality of fin structures between the source and drain region portions.

12. The semiconductor device of claim 11, wherein the gate structure comprises a gate dielectric on the channel region portion and at least one gate conductor on the gate dielectric.

13. The semiconductor device of claim 9, wherein the dielectric spacer has a height that is less than a height of the plurality of fin structures.

14. A semiconductor device comprising:
a plurality of fin structures;
a dielectric spacer in a space between adjacent fin structures of said plurality of fin structures, wherein the dielectric spacer has a height that is less than a height of the plurality of fin structures; and
an epitaxial semiconductor present on a first sidewall of a first fin structure of the adjacent fin structures and a second sidewall of a second fin structure of the adjacent fins structures, wherein the epitaxial semiconductor material that is in contact with the first and second fin structures also contacts the dielectric spacer.

15. The semiconductor device of claim 14, wherein the epitaxial semiconductor present on the first fin structure is separate from the epitaxial semiconductor present on the second fin structure.

16. The semiconductor device of claim 14, wherein the epitaxial semiconductor material is present on source and drain region portions of the plurality of fin structures, and a gate structure is present on a channel region portion of the plurality of fin structures between the source and drain region portions.

17. The semiconductor device of claim 14, wherein the gate structure comprises a gate dielectric on the channel region portion and at least one gate conductor on the gate dielectric.

18. The semiconductor device of claim 14, wherein the plurality of fin structures includes a first group of fin structures having a first pitch and a second group of fin structures having a second pitch.

19. The semiconductor device of claim 18, wherein the dielectric spacer is self-aligned to a central position of the first pitch and second pitch.

20. The semiconductor device of claim 19, wherein the first pitch is greater than the second pitch, and the dielectric spacer between adjacent semiconductor fin structures in the first group having the first pitch has a width that is greater than the dielectric spacer between adjacent semiconductor fin structures in the second group having the second pitch.

* * * * *